US012811583B2

(12) United States Patent
Li et al.

(10) Patent No.: US 12,811,583 B2
(45) Date of Patent: Nov. 24, 2026

(54) RADIO FREQUENCY SWITCHING CIRCUIT HAVING HIGH TOLERANCE POWER, CHIP AND ELECTRONIC DEVICE THEREOF

(71) Applicant: SHANGHAI VANCHIP TECHNOLOGIES CO., LTD., Shanghai (CN)

(72) Inventors: Yanli Li, Shanghai (CN); Silong Zhang, Shanghai (CN)

(73) Assignee: SHANGHAI VANCHIP TECHNOLOGIES CO., LTD., Shanghai (CN)

(*) Notice: Subject to any disclaimer, the term of this patent is extended or adjusted under 35 U.S.C. 154(b) by 19 days.

(21) Appl. No.: 19/031,338

(22) Filed: Jan. 18, 2025

(65) Prior Publication Data

US 2025/0167782 A1 May 22, 2025

Related U.S. Application Data

(63) Continuation of application No. PCT/CN2023/108487, filed on Jul. 20, 2023.

(51) Int. Cl.
*H03K 17/56* (2006.01)
*H03K 19/003* (2006.01)

(52) U.S. Cl.
CPC .................................... *H03K 17/56* (2013.01)

(58) Field of Classification Search
CPC ........ H03K 17/56; H03K 17/51; H03K 17/16; H03K 17/161; H03K 17/162; H03K 17/00; H03K 17/041; H03K 17/04106; H03K 19/003; H03K 19/00315
USPC ........................................ 327/574, 576, 581
See application file for complete search history.

(56) References Cited

U.S. PATENT DOCUMENTS

| | | | | |
|---|---|---|---|---|
| 11,290,105 B1 * | 3/2022 | Kovac | .................. | H03K 17/693 |
| 12,176,888 B2 * | 12/2024 | Genc | .................... | H03K 17/162 |
| 2025/0167781 A1 * | 5/2025 | Wang | ..................... | H03K 17/56 |

* cited by examiner

*Primary Examiner* — Hai L Nguyen
(74) *Attorney, Agent, or Firm* — George Guosheng Wang; Upstream Research and Patent LLC

(57) ABSTRACT

A radio frequency switching circuit which has high tolerance power, a chip and an electronic device thereof. The radio frequency switching circuit is composed of multiple stages of switching transistor units connected in series. According to the radio frequency switching circuit, the phenomenon of uneven distribution of a voltage swing in stages of a switching transistor stacking chain is improved, so that the problem of nonlinearity of the radio frequency switching circuit is improved, the insertion loss is reduced, and the average tolerance power is significantly improved.

16 Claims, 6 Drawing Sheets

RADIO FREQUENCY SWITCHING CIRCUIT HAVING HIGH TOLERANCE POWER, CHIP AND ELECTRONIC DEVICE THEREOF

BACKGROUND

Technical Field

The present invention relates to the technical field of radio frequency (RF) circuits, and in particular, to an RF switching circuit having a high tolerance power, a chip including the RF switching circuit, and a corresponding electronic device.

Related Art

In the field of communications technologies, as one of the important components of a radio frequency (RF) front-end module, an RF switching circuit is configured to accurately switch and control a transmission path of an RF signal, select a corresponding RF path, and receive/transmit the RF signal in a case that a wireless communication system shares an antenna.

Generally, a communication quality of the fifth generation (5G) communication system mainly depends on two performance indicators, namely, an insertion loss and a power withstanding capability of the RF switching circuit. In other words, a higher average power withstanding capability of the RF switching circuit and a lower insertion loss lead to a better signal quality of a communication system. In the RF front-end module, especially in a case that the RF switching circuit is used as an antenna tuning, higher voltage and power are withstood. Therefore, the RF switching circuit is required to have a higher average power withstanding capability.

SUMMARY

A primary technical problem to be solved in the present invention is to provide a radio frequency (RF) switching circuit having a high tolerance power.

Another technical problem to be resolved in the present invention is to provide a chip including the foregoing RF switching circuit and a corresponding electronic device.

To achieve the foregoing objectives, the present invention adopts the following technical solutions.

According to a first aspect of an embodiment of the present invention, an RF switching circuit having a high tolerance power is provided, including a plurality of stages of switch transistor units connected in series. The switch transistor unit in each stage includes a first transistor, a second transistor, a first bias resistor, a second bias resistor, and a path resistor.

A bulk of the first transistor is connected to a source and a bulk of the second transistor, and a drain of the second transistor is connected to a first path formed by the first bias resistors in the stages of switch transistor units connected in series in sequence.

A drain of the first transistor is connected to an output terminal of the switch transistor unit in a previous stage, a source of the first transistor is connected to a gate of the second transistor, and also connected to a drain of a first transistor in the switch transistor unit in a next stage, and the path resistor is arranged between the drain and the source of the first transistor.

A gate of the first transistor is connected to a second path formed by the second bias resistors in the stages of switch transistor units connected in series in sequence.

A tail end of the first path and a tail end of the second path are connected to a gate bias voltage.

According to a second aspect of an embodiment of the present invention, an RF switching circuit having a high tolerance power is provided, including a plurality of stages of switch transistor units connected in series. The switch transistor unit in each stage includes a first transistor, a second transistor, a first bias resistor, a second bias resistor, and a path resistor.

A bulk of the first transistor is connected to a source and a bulk of the second transistor, and a gate of the first transistor is connected to a first path formed by the first bias resistors in the stages of switch transistor units connected in series in sequence.

A drain of the first transistor is connected to an output terminal of the switch transistor unit in a previous stage, a source of the first transistor is connected to a gate of the second transistor, and also connected to a drain of a first transistor in the switch transistor unit in a next stage, and the path resistor is arranged between the drain and the source of the first transistor.

A drain of the second transistor is connected to a second path formed by the second bias resistors in the stages of switch transistor units connected in series in sequence.

A tail end of the first path and a tail end of the second path are connected to a gate bias voltage.

Preferably, in odd-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence; and in even-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence.

Alternatively, in the odd-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence; and in even-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence.

Preferably, in an initial stage of the plurality of stages of switch transistor units, the drain of the first transistor is connected to a signal input terminal of the RF switching circuit and a capacitor, and another end of the capacitor is connected to the drain of the second transistor.

Preferably, an output terminal of the switch transistor unit in each stage is a source of a first transistor in the switch transistor unit in the stage.

Preferably, in the switch transistor unit in each stage, the source of the first transistor is connected to the gate of the second transistor.

Preferably, when the RF switching circuit is in an on state, a gate voltage and a bulk voltage of the first transistor in the stages of switch transistor units are respectively equal to half of a sum of a drain voltage and a source voltage.

Preferably, when the RF switching circuit is in an off state, a direct current (DC) voltage of the bulk of the first transistor in the stages of switch transistor units is the gate bias voltage.

According to a third aspect of an embodiment of the present invention, an integrated circuit chip is provided. The integrated circuit chip includes the foregoing RF switching circuit.

According to a fourth aspect of an embodiment of the present invention, an electronic device is provided. The electronic device includes the foregoing RF switching circuit.

Compared with the prior art, the RF switching circuit having a high tolerance power provided in the present invention not only adopts the technical solution that the gates of the switch transistors in the stages are connected to a bias circuit composed of series resistors, but also adopts a technical solution that the bulks of the switch transistors in the stages are connected through a bias circuit composed of a transistor and the series resistors, which effectively improves a phenomenon of uneven distribution of voltage swings in a stacked chain of the switch transistors in the stages. Therefore, a problem of nonlinearity of the RF switching circuit is alleviated, an insertion loss is reduced, and an average power withstanding capability is significantly improved. Therefore, the RF switching circuit having a high tolerance power provided in the present invention has beneficial effects of an ingenious structure design, low production costs, a small chip size, and an excellent operating performance.

DETAILED DESCRIPTION

Technical solutions of the present invention are further described in detail below with reference to drawings and specific embodiments.

To describe the technical solutions of the present invention more clearly, the inventor first analyzes in detail a problem existing in a typical RF switching circuit in the prior art.

Figure 1:
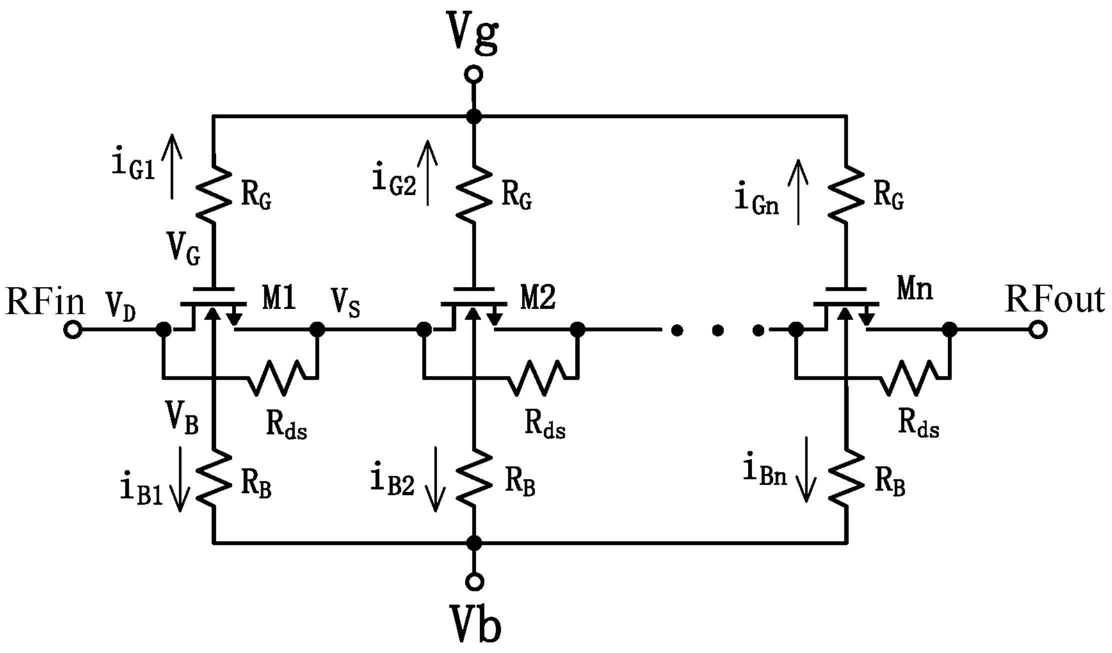
FIG. 1 is a schematic circuit diagram of a typical radio frequency (RF) switching circuit in the prior art.

In the prior art, a method for increasing an average power withstanding capability of a radio frequency (RF) switching circuit is generally a transistor stacking method. In the method, the RF switching circuit includes a plurality of switch transistors connected in series. A typical circuit thereof is shown in FIG. 1. The RF switching circuit includes switch transistors M1, M2, . . . , and Mn (n being a positive integer, and n≥3) connected in series. A drain of the switch transistor M1 is connected to a signal input terminal RFin of the RF switching circuit. A source of the switch transistor Mn is connected to a signal output terminal RFout of the RF switching circuit. A gate bias voltage Vg is separately connected to a gate of each switch transistor through each gate bias resistor $R_G$. A bulk bias voltage Vb is separately connected to a bulk of each switch transistor through each bulk bias resistor $R_B$. A path resistor Rds is connected in parallel between a drain and a source of each switch transistor. Although the RF switching circuit can improve the average power withstanding capability, problems still exist in two aspects. In one aspect, a voltage swing of the RF switching circuit is unevenly distributed in a stacked chain of the switch transistor, which leads to limitation on improvement of the average power withstanding capability of the RF switching circuit. In the other aspect, an increase in a quantity of switch transistors stacked in the RF switching circuit results in an increase in an insertion loss and an increase in an area of a chip occupied by the RF switching circuit.

As shown in FIG. 1, when the RF switching circuit is in an off state, a voltage difference between a source and a drain of each of the series-connected transistors in the stages often exhibits an uneven distribution due to differences in performance of components and devices and factors such as a circuit structure. In addition, with an increase in input power of the RF signal, a voltage difference between the drain or the source and a bulk of each of the transistors in the stages gradually increases.

Specifically, in one aspect, when a drain voltage $V_D$ of the transistor rises and starts to be greater than 0 and reaches a specific value, a reverse PN junction between the drain and the bulk is caused to generate a direct current (DC). The DC generates a voltage drop across the bulk bias resistor $R_B$, which increases a bulk voltage $V_B$. When a voltage difference between the bulk and the source of the transistor rises and reaches a specific value, a PN junction between the bulk and the source is turned on, causing the RF switching circuit to rapidly generate a large quantity of harmonics, and resulting in a serious nonlinear phenomenon, which significantly reduces the average power withstanding capability of the RF switching circuit.

In another aspect, when the drain voltage $V_D$ of the transistor decreases and starts to be less than 0 and reaches a specific value, a reverse PN junction between the source and the bulk is caused to generate the DC. The DC generates a voltage drop across the bulk bias resistor $R_B$, which increases the bulk voltage $V_B$. When a voltage difference between the bulk and the drain of the transistor rises and reaches a specific value, a PN junction between the bulk and the drain is turned on, causing the RF switching circuit to rapidly generate a large quantity of harmonics, and resulting in a serious nonlinear phenomenon, which seriously reduces the average power withstanding capability of the RF switching circuit.

It may be learned that the RF switching circuit using the transistor stacking method shown in FIG. 1 causes the voltage swing of the RF switching circuit to be unevenly distributed in the stacked chain of the switch transistor, due to an existence of a DC current $i_G$ of the gate and the DC current $i_B$ of the bulk of the transistor. Therefore, the nonlinear phenomenon the RF switching circuit is increased and the average power withstanding capability is decreased.

To resolve the problem existing in the foregoing RF switching circuit, an embodiment of the present invention provides an RF switching circuit having a high tolerance power. The RF switching circuit includes n (n being a positive integer and n≥3) stages of switch transistor units connected in series, including a first-stage switch transistor unit (that is, an initial-stage switch transistor unit, a first unit shown in FIG. 2), n−2 intermediate-stage switch transistor units (a second unit, a third unit, . . . , and an $(n-1)^{th}$ unit shown in FIG. 2), and an $n^{th}$-stage switch transistor unit (that is, a final-stage switch transistor unit, an $n^{th}$ unit shown in FIG. 2). An input terminal of the first-stage switch transistor unit is connected to the signal input terminal RFin of the RF switching circuit. An output terminal of the first-stage switch transistor unit is connected to an input terminal of an initial-stage unit in the n−2 intermediate-stage switch transistor units. In the n−2 intermediate-stage switch transistor units, each unit is connected in series with each other, and so on. An output terminal of an $(n-1)^{th}$ intermediate-stage switch transistor unit is connected to an input terminal of the $n^{th}$-stage (that is, a final-stage) switch transistor unit. An output terminal of the $n^{th}$-stage switch transistor unit is connected to the signal output terminal RFout of the RF switching circuit.

Figure 2:
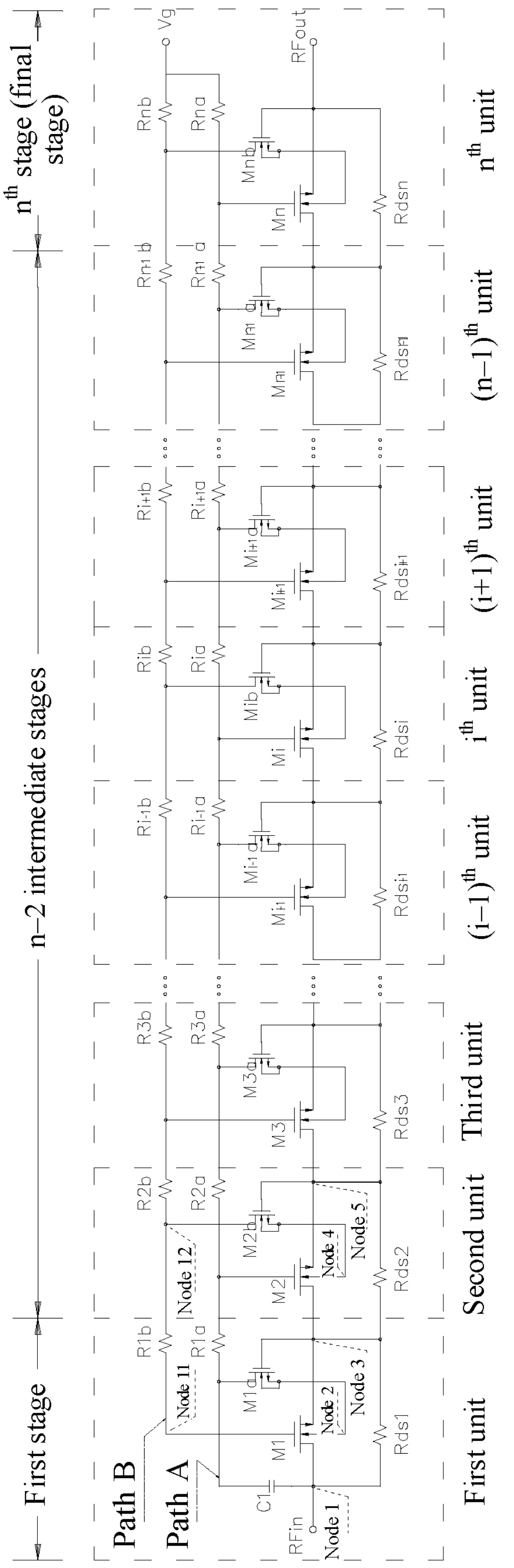
FIG. 2 is a schematic circuit diagram of an RF switching circuit having a high tolerance power in an embodiment of the present invention.

As shown in FIG. 2, the first-stage switch transistor unit, the n−2 intermediate-stage switch transistor units, and the $n^{th}$-stage switch transistor unit have substantially a same circuit structure, including a first transistor, a second transistor, a first bias resistor, a second bias resistor, and a path resistor. It should be noted that the transistor in each embodiment of the present invention is preferably an N-metal-oxide-semiconductor (NMOS) transistor, but may also be a p-channel MOS (PMOS) transistor.

In a first embodiment of the present invention, a bulk of the first transistor in the switch transistor unit in each stage is connected to a source and a bulk of the second transistor. A drain of the second transistor is connected to a path B formed by the first bias resistors in the stages of switch transistor units connected in series in sequence. A tail end of the path B is connected to the gate bias voltage Vg. A drain of the first transistor is connected to an output terminal (that is, a source of the first transistor in the switch transistor unit in the stage) of the switch transistor unit in a previous stage. A source of the first transistor is connected to a gate of the second transistor, and connected to a drain of a first transistor in the switch transistor unit in a next stage. In another aspect, a gate of the first transistor is connected to a path A formed by the second bias resistors in the stages of switch transistor units connected in series in sequence. A tail end of the path A and the tail end of the path B are jointly connected to the gate bias voltage Vg. The path resistor is arranged between the drain and the source (which is also the gate of the second transistor) of the first transistor.

In a second embodiment of the present invention, a bulk of the first transistor is connected to a source and a bulk of the second transistor. A drain of the second transistor is connected to a path A formed by the second bias resistors in the stages of switch transistor units connected in series in sequence. A tail end of the path A is connected to the gate bias voltage Vg. A drain of the first transistor is connected to an output terminal (that is, a source of the first transistor in the switch transistor unit in the stage) of the switch transistor unit in a previous stage. A source of the first transistor is connected to a gate of the second transistor, and connected to a drain of a first transistor in the switch transistor unit in a next stage. In another aspect, a gate of the first transistor is connected to a path B formed by the first bias resistors in the stages of switch transistor units connected in series in sequence. The tail end of the path A and a tail end of the path B are jointly connected to the gate bias voltage Vg. The path resistor is arranged between the drain and the source (which is also the gate of the second transistor) of the first transistor.

It should be noted that, in another embodiment of the present invention, the circuit structure of the switch transistor unit provided in the first embodiment and the circuit structure of the switch transistor unit provided in the second embodiment may be arranged in a staggered manner. In other words, gates of first transistors of odd-numbered-stage switch transistor units are all connected to the path B formed by the first bias resistors in the stages of switch transistor units connected in series in sequence. Gates of first transistors of even-numbered-stage switch transistor units are all connected to the path A formed by the second bias resistors in the stages of switch transistor units connected in series in sequence. The tail end of the path A and the tail end of the path B are jointly connected to the gate bias voltage Vg. Alternatively, the gates of the first transistors of the odd-numbered-stage switch transistor units are all connected to the path A formed by the second bias resistors in the stages of switch transistor units connected in series in sequence. The gates of the first transistors of the even-numbered-stage switch transistor units are all connected to the path B formed by the first bias resistors in the stages of switch transistor units connected in series in sequence. The tail end of the path A and the tail end of the path B are jointly connected to the gate bias voltage Vg.

The first-stage (that is, an initial-stage) switch transistor unit, the intermediate-stage switch transistor unit, and the $n^{th}$-stage (that is, a final-stage) switch transistor unit are respectively used as examples to describe specific circuit structures thereof below.

As shown in FIG. 2, the first-stage (that is, the initial-stage) switch transistor unit includes a first transistor M1, a second transistor M1*a*, a first bias resistor R1*b*, a second bias resistor R1*a*, a path resistor Rds1, and a capacitor C1. A gate of the first transistor M1 is connected to the first bias resistor R1*b*. Another end of the first bias resistor R1*b* is connected to the first bias resistor R2*b* and the drain of the second transistor M2*b* in the intermediate-stage switch transistor unit. The drain of the first transistor M1 is connected to the signal input terminal RFin of the RF switching circuit and the capacitor C1. The source of the first transistor M1 is connected to the gate of the second transistor M1*a* on the one hand, and connected to the drain of the first transistor M2 in the intermediate-stage switch transistor unit on the other hand. Two ends of the path resistor Rds1 are respectively connected to the drain and the source of the first transistor M1. The bulk of the first transistor M1 is connected to the source of the second transistor M1*a*. The source and the bulk of the second transistor M1*a* are directly connected, and the drain of the second transistor M1*a* is connected to the second bias resistor R1*a* and another end of the capacitor C1. Another end of the second bias resistor R1*a* is connected to the gate of the first transistor M2 and the second bias resistor R2*a* in the intermediate-stage switch transistor unit.

Still as shown in FIG. 2, the n−2 intermediate-stage switch transistor units have substantially the same circuit structure. Therefore, a specific description is made by using an $i^{th}$-stage (i being a positive integer greater than 1 and is less than n) intermediate-stage switch transistor unit as an example. It is assumed that i is an even number. The $i^{th}$-stage intermediate-stage switch transistor unit includes a first transistor Mi, a second transistor Mib, a first bias resistor Rib, a second bias resistor Ria, and a path resistor Rdsi. A gate of the first transistor Mi is connected to the second bias resistor Ria, and also connected to a second bias resistor R(i−1)a in the switch transistor unit in a previous stage (that is, an $(i-1)^{th}$ stage). Another end of the second bias resistor Ria is respectively connected to a drain of a second bias resistor R(i+1)a in the switch transistor unit in a next stage (that is, an $(i+1)^{th}$ stage) and a drain of a second transistor M(i+1)a. A drain of the first transistor Mi is connected to a source of a first transistor M(i−1) and a gate of a second transistor M(i−1)a in the switch transistor unit in a previous stage (that is, the $(i-1)^{th}$ stage). A source of the first transistor Mi is connected to a gate of the second transistor Mib, and also connected to the drain of the first transistor M(i+1) in the switch transistor unit in a next stage (that is, the $(i+1)^{th}$ stage). Two ends of the path resistor Rdsi are respectively connected to the drain and the source of the first transistor Mi. A bulk of the first transistor Mi is connected to a source of the second transistor Mib. The source and a bulk of the second transistor Mib are directly short-circuited. A drain of the second transistor Mib is connected to the first bias resistor Rib, and also connected to a first bias resistor R(i−1)b in the switch transistor unit in a previous stage (that is, the $(i-1)^{th}$ stage). Another end of the first bias resistor Rib is connected to a gate of the first transistor M(i+1) in the switch transistor unit in a next stage (that is, the $(i+1)^{th}$ stage) and the first bias resistor R(i+1)b.

Still as shown in FIG. 2, the $n^{th}$-stage (that is, the final-stage) switch transistor unit includes a first transistor Mn, a second transistor Mnb, a first bias resistor Rnb, a second bias resistor Rna, and a path resistor Rdsn. A gate of the first transistor Mn is connected to the second bias resistor Rna, and also connected to a second bias resistor R(n−1)a in the switch transistor unit in a previous stage (that is, an $(n-1)^{th}$ stage). Another end of the second bias resistor Rna is connected to the first bias resistor Rnb, and then jointly connected to the gate bias voltage Vg. A drain of the first transistor Mn is connected to a source of a first transistor M (n−1) and a gate of a second transistor M (n−1)a in the switch transistor unit in a previous stage (that is, the $(n-1)^{th}$ stage). A source of the first transistor Mn is connected to a gate of the second transistor Mnb, and also connected to the signal output terminal RFout of the RF switching circuit. Two ends of the path resistor Rdsn are respectively connected to the drain and the source of the first transistor Mn. A bulk of the first transistor Mn is connected to a source of the second transistor Mnb. The source and a bulk of the second transistor Mnb are directly short-circuited. A drain of the second transistor Mnb is connected to another end of the first bias resistor Rnb, and also connected to a first bias resistor R(n−1)b in the switch transistor unit in a previous stage (that is, the $(n-1)^{th}$ stage) switch transistor unit.

It may be learned from the detailed description of the foregoing circuit structure that, in the initial-stage switch transistor unit, except that the capacitor C1 is connected between the drain of the first transistor and the drain of the second transistor, the circuit structure of another part is also substantially the same as that of the intermediate-stage switch transistor unit and the final-stage switch transistor unit.

An operating principle of the RF switching circuit having a high tolerance power provided in this embodiment of the present invention is analyzed and described in detail below.

When the RF switching circuit is in an on state, the first transistors M1, M2, M3, . . . , and Mn in the stages of switch transistor units are in the on state. In this case, it is assumed that n is an even number. The gates of the first transistors M1, M3, M5, . . . , and Mn−1 in the odd-numbered-stage switch transistor units are all connected to the path B formed by the first bias resistors in the stages of switch transistor units connected in series. The gates of the first transistors M2, M4, M6, . . . , and Mn in the even-numbered-stage switch transistor units are all connected to the path A formed by the second bias resistors in the stages of switch transistor units connected in series. The tail end of the path B and the tail end of the path A are jointly connected to the gate bias voltage Vg.

Therefore, the voltage of the gates of the first transistors M1, M2, M3, . . . , and Mn in the stages of switch transistor units is the gate bias voltage Vg. In addition, in this case, the gate bias voltage Vg is a positive value. The DC voltage of the drain and the source of the first transistors M1, M2, M3, . . . , and Mn in the stages of switch transistor units is 0. In addition, the DC voltage of the gates of the second transistors M1*a*, M2*b*, M3*a*, M4*b*, . . . , and Mnb in the stages of switch transistor units is 0. The drains of the second transistors M1*a*, M3*a*, M5*a*, . . . , and Mn-1*a* of the odd-numbered-stage switch transistor units are all connected to the path A. The drains of the second transistors M2*b*, M4*b*, and M6*b*, . . . , and Mnb of the even-numbered-stage switch transistor units are all connected to the path B. Therefore, the DC voltage of the drains of the second transistors M1*a*, M2*b*, M3*a*, M4*b*, . . . , and Mnb in the stages of switch transistor units are the gate bias voltage Vg, and the gate bias voltage Vg is a positive value. The second transistors M1*a*, M2*b*, M3*a*, M4*b*, . . . , and Mnb in the stages of switch transistor units are in the off state. As a result, the bulks of the first transistors M1, M2, M3, . . . , and Mn in the stages of switch transistor units are in a suspended state. Therefore, the PN junction between the bulk and the source and the drain as a result of the increase in the DC voltage of the bulk does not occur. The DC voltage of the gates of the first transistors M1, M2, M3, . . . , and Mn in the stages of switch transistor units is reduced and a turn-on resistance becomes large, which avoids an increase in the insertion loss caused by the increase in the turn-on resistance.

When the RF switching circuit is in the off state, the first transistors M1, M2, M3, . . . , and Mn in the stages of switch transistor units are in the off state. The voltage of the gates of the first transistors M1, M2, M3, . . . , and Mn in the stages of switch transistor units is the gate bias voltage Vg. In addition, in this case, the gate bias voltage Vg is a negative value. The DC voltage of the drain and the source of the first transistors M1, M2, M3, . . . , and Mn in the stages of switch transistor units is 0. In addition, in other words, the DC voltage of the gates of the second transistors M1*a*, M2*b*, M3*a*, M4*b*, . . . , and Mnb in the stages of switch transistor units is 0. The DC voltage of the drains of the second transistors M1*a*, M2*b*, M3*a*, M4*b*, . . . , and Mnb in the stages of switch transistor units is the gate bias voltage Vg. In addition, the gate bias voltage Vg is the negative value. Therefore, the second transistors M1*a*, M2*b*, M3*a*, M4*b*, . .

. . , and Mnb in the stages of switch transistor units are in the on state, so that the DC voltage of the bulks of the first transistors M1, M2, M3, . . . , and Mn in the stages of switch transistor units is the gate bias voltage Vg.

It should be noted that when n is an odd number, the stages of switch transistor units have a similar operating state. Details are not described herein.

In an embodiment of the present invention, the resistance values of the first bias resistors in the stages of switch transistor units are equal and set to a kilohm level. The resistance values of the second bias resistors in the stages of switch transistor units are also equal, and is set to a kilohm level. Correspondingly, a capacitance value of the capacitor is set to an fF level. When the signal input terminal RFin of the RF switching circuit inputs the RF signal, the AC voltages of the gates and the bulks of the first transistors M1, M2, M3, . . . , and Mn in the stages of switch transistor units may be made approximately equal. In addition, parasitic capacitance of the gates and the drains and parasitic capacitance of the gates and the sources of the first transistors M1, M2, M3, . . . , and Mn in the stages of switch transistor units may be respectively considered equal. Therefore, the voltage of the gates and the voltage of bulks of the first transistors M1, M2, M3, . . . , and Mn in the stages of switch transistor units are respectively equal to half of a sum of the drain voltages and the source voltages.

Next, a first unit and a second unit in FIG. 2 are used as an example. Alternating current (AC) voltages at a node 11 and a node 12 are calculated as follows:

$$V_{11}=V_2=Vg+(V_1+V_3)/2 \quad (1)$$

$$V_{12}=V_4=Vg+(V_3+V_5)/2 \quad (2)$$

where $V_{11}$ is an AC voltage at the gate (that is, the node 11) of the first transistor M1, $V_2$ is an AC voltage of the bulk (that is, a node 2) of the first transistor M1, $V_1$ is an AC voltage of the drain (that is, a node 1) of the first transistor M1, $V_3$ is an AC voltage of the source (that is, a node 3) of the first transistor M1 and the drain (that is, the node 3) of the first transistor M2, $V_{12}$ is an AC voltage of the drain (that is, the node 12) of the second transistor M2*b*, $V_4$ is an AC voltage of the bulk (that is, a node 4) of the first transistor M2 and the source (that is, the node 4) of the second transistor M2*b*, $V_5$ is an AC voltage of a source of the first transistor M2, and Vg is the gate bias voltage.

In this case, an AC $i_{R1b}$ on the first bias resistor R1*b* is calculated as follows:

$$i_{R1b}=(V_{11}-V_{12})/R_{1b} \quad (3)$$

where $R_{1b}$ is a resistance value of the first bias resistor R1*b*.

According to Formula 1 and Formula 2, Formula 3 may be expressed as follows:

$$i_{R1b}=(V_1-V_5)/2R_{1b} \quad (4)$$

In Formula 4, $(V_1-V_5)$ is a voltage difference between the drain of the first transistor M1 and the source of the first transistor M2. Generally, when the transistor is in normal operation, the voltage difference between the drain and the source of the transistor is very small, which generally does not exceed 4 V. It may be learned from Formula 4 that the AC $i_{R1b}$ on the first bias resistor R1*b* is less than $4/R_{1b}$. Similarly, all the first bias resistors and all the second bias resistors in the stages of switch transistor units may be learned. The AC on each bias resistor is less than the voltage difference divided by the resistance value of the resistor. In addition, the first bias resistors in the stages of switch transistor units are connected in series in sequence respectively to form the path B connected to the gate bias voltage Vg. The second bias resistors in the stages of switch transistor units are connected in series in sequence respectively to form the path A connected to the gate bias voltage Vg.

Therefore, in the RF switching circuit provided in this embodiment of the present invention, leakage currents of the gates and the bulks of the first transistors in the stages of switch transistor units are significantly reduced, so that a proportion of the current flowing through the first transistors M1, M2, M3, . . . , and Mn in the stages of switch transistor units increases. On a positive side, an unbalanced voltage distribution of the first transistors M1, M2, M3, . . . , and Mn in the stages of switch transistor units is alleviated. On a negative side, an increase in the DC voltage at the bulk may occur in the first transistors M1, M2, M3, . . . , and Mn in the stages of switch transistor units only under higher RF input power. Therefore, the RF switching circuit provided in this embodiment of the present invention effectively alleviates the problem of nonlinearity of the switching circuit and increases the average power withstanding capability of the RF switching circuit.

In addition, various embodiments or variant examples of the present invention are described in a related manner, and identical and similar parts among various embodiments or variant examples may be referred to each other. Each embodiment or variant example highlights a difference from another embodiment, but the embodiments and the variant examples are all implemented based on the operating principle of the RF switching circuit. Details are not described herein again.

To verify an excellent performance of the RF switching circuit provided in the embodiments of the present invention, the inventor performs a plurality of comparative simulation tests on a prior-art solution shown in FIG. 1 and the technical solution provided in this embodiment of the present invention shown in FIG. 2.

Figure 3:
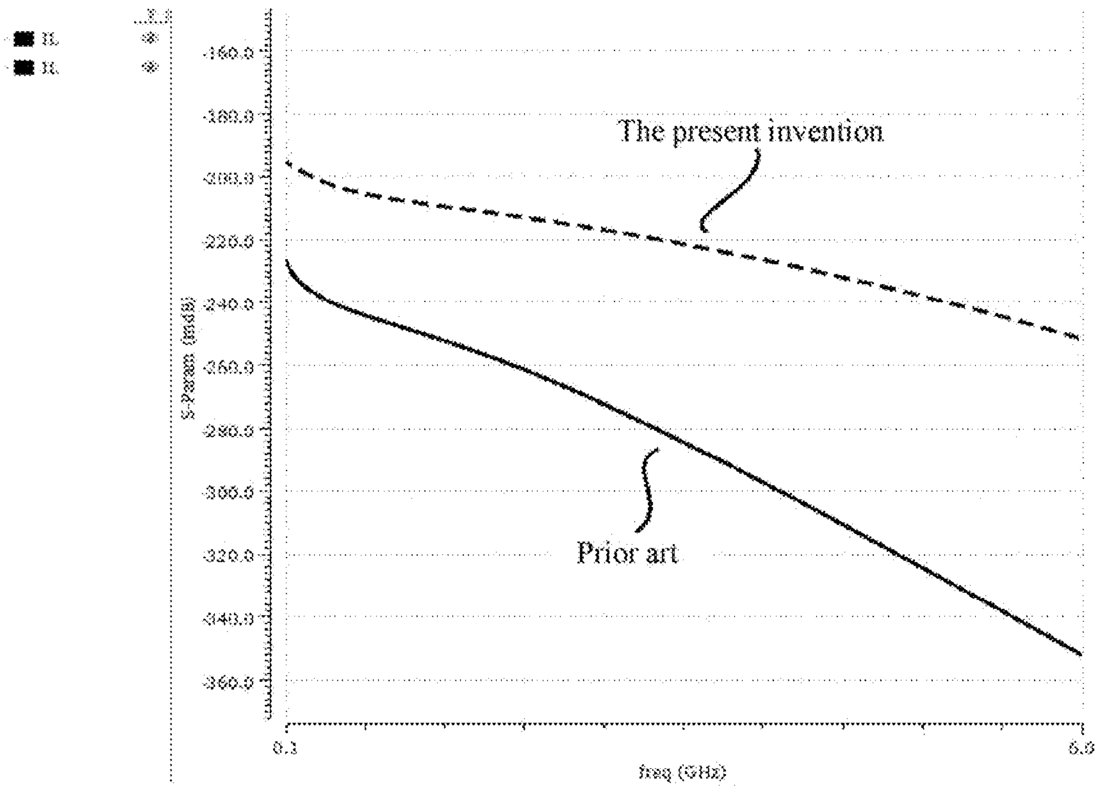
FIG. 3 is a comparison diagram of a simulation test of an insertion loss of an RF switching circuit in the present invention.

FIG. 3 shows a simulation test result of an insertion loss of an RF switching circuit. An abscissa is a frequency of an RF signal, and an ordinate is the insertion loss. It may be learned from FIG. 3 that, in a frequency range of 0.1 GHz to 6 GHz, the insertion loss of the RF switching circuit provided in this embodiment of the present invention is significantly better than the insertion loss of a current technical solution.

Figure 4:
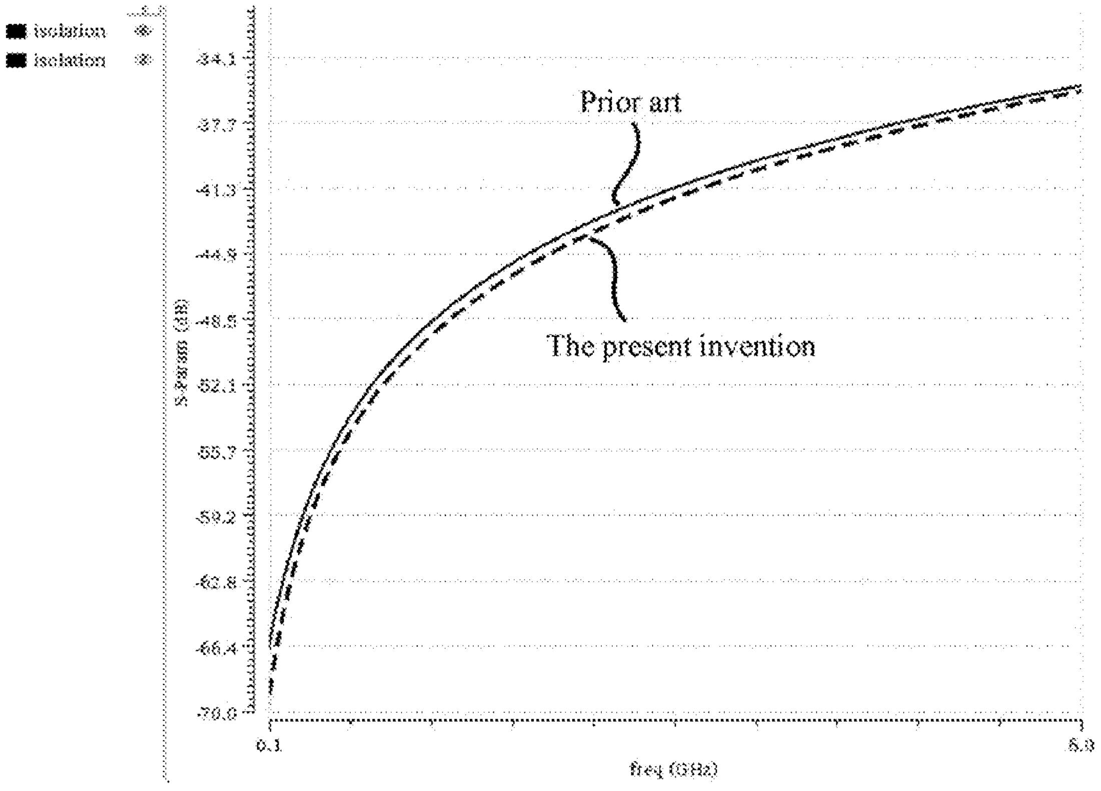
FIG. 4 is a comparison diagram of a simulation test of an isolation degree of an RF switching circuit in the present invention.

FIG. 4 is a simulation test result of an isolation degree of an RF switching circuit. An abscissa is a frequency of an RF signal, and an ordinate is the isolation degree. It may be learned from FIG. 4 that, in the frequency range of 0.1 GHz to 6 GHz, the isolation degree of the RF switching circuit provided in this embodiment of the present invention is close to that of the RF switching circuit in the prior-art solution, and substantially does not change.

Figure 5:
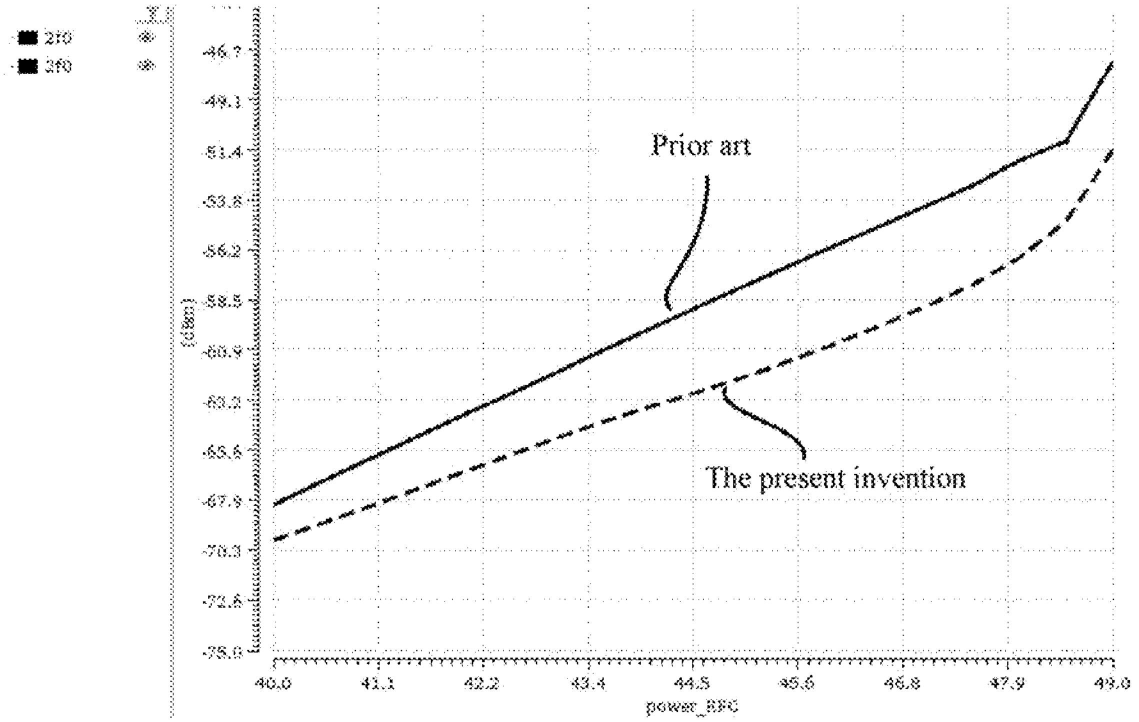
FIG. 5 is a comparison diagram of a simulation test of second-order harmonics of an RF switching circuit in the present invention.

FIG. 5 shows a simulation test result of second-order harmonics of an RF switching circuit. An abscissa is RF power, and an ordinate is a second-order harmonic value. It may be learned from FIG. 5 that when inputted RF power reaches a certain power value, the RF switching circuit in the prior-art solution has a sudden harmonic change and a sharp nonlinear deterioration. However, in the RF switching circuit provided in this embodiment of the present invention, a harmonic characteristic is still within a range of a linear growth under a same inputted power value.

Figure 6:
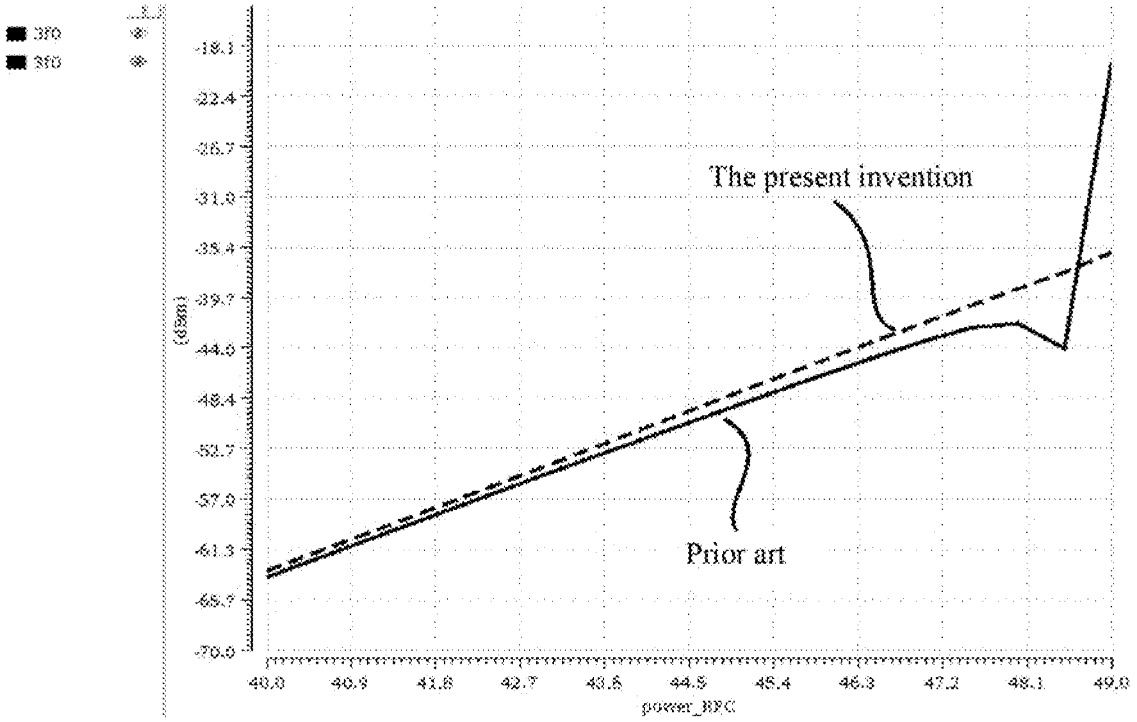
FIG. 6 is a comparison diagram of a simulation test of third-order harmonics of an RF switching circuit in the present invention.

FIG. 6 shows a simulation test result of third-order harmonics of an RF switching circuit. An abscissa is RF power, and an ordinate is a third-order harmonic value. It may be learned from FIG. 6 that when inputted RF power reaches a certain power value, the RF switching circuit in the prior-art solution has a sudden harmonic change and a sharp nonlinear deterioration. However, in the RF switching circuit provided in this embodiment of the present invention, a harmonic characteristic is still within a range of a linear growth under a same inputted power value.

Figure 7:
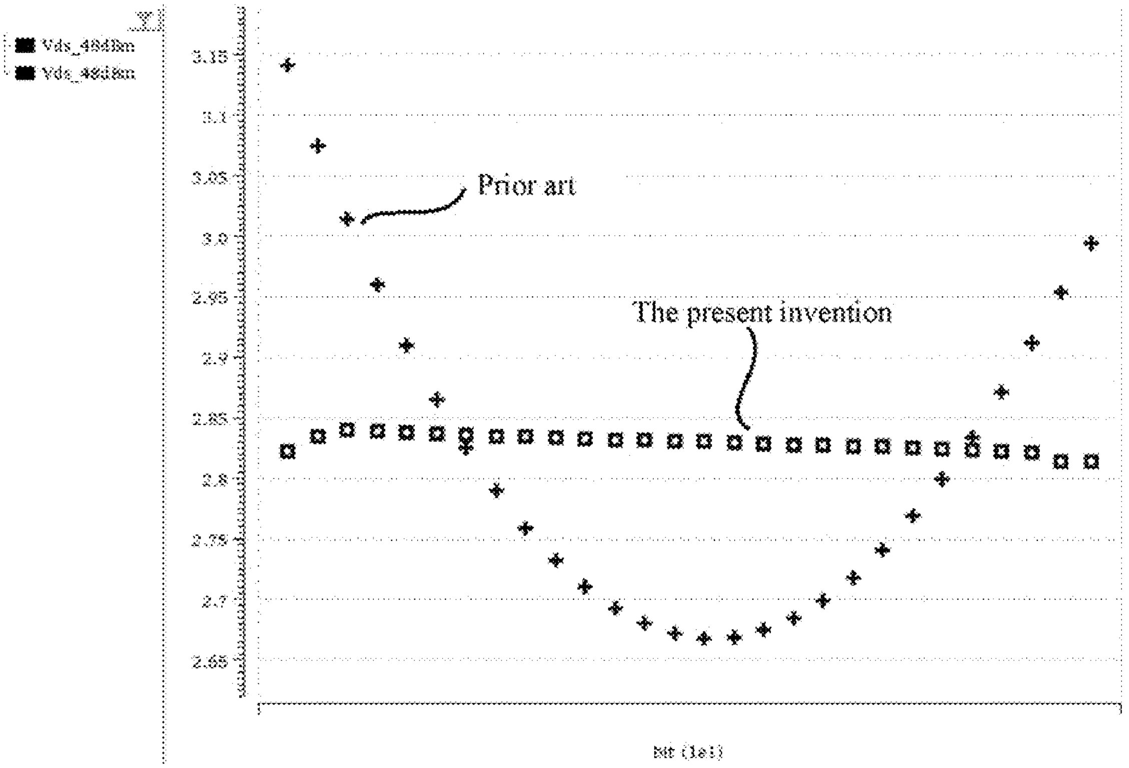
FIG. 7 is a comparison diagram of a voltage difference between a drain and a source of a first transistor when input power of an RF switching circuit is 48 dBm in the present invention.

FIG. 7 is a comparison diagram of a voltage difference between a drain and a source of a first transistor when input power of an RF switching circuit is 48 dBm. An abscissa is first transistors M1, M2, M3, . . . , and M28 in the stages of switch transistor units. An ordinate is a voltage difference between the drain and the source of the first transistor. It may be learned from FIG. 7 that in the RF switching circuit in the prior-art solution, the voltage swing is excessively unevenly distributed in the stacked chain of the switch transistor. A voltage difference between the drain and the source of the first transistor is in a range of 2.67 V to 3.14 V, and a voltage difference change is 0.47 V. In the RF switching circuit provided in this embodiment of the present invention, the voltage swing is excessively evenly distributed in the stacked chain of the switch transistors, and the voltage difference between the drain and the source of the first transistor is in a range of 2.81 V to 2.85.V, and the voltage difference change is only 0.04 V.

An embodiment of the present invention further provides an integrated circuit chip. The integrated circuit chip includes an RF switching circuit having a high tolerance power provided in the foregoing embodiments, which is used in the RF front-end module of the wireless communication system and configured to accurately switch and control the transmission path of the RF signal, and to select a corresponding RF path. A specific structure of the RF switching circuit in the integrated circuit chip is not described herein again.

In addition, the RF switching circuit provided in the present invention may further be used in an electronic device, which is used as an important part of a communication assembly. The electronic device mentioned herein refers to a computer device that may be used in a mobile environment and support a plurality of communication standards such as GSM, EDGE, TD_SCDMA, TDD_LTE, FDD_LTE, and 5G. The computer device includes a mobile phone, a notebook computer, a tablet computer, an on-board computer, and the like. In addition, the technical solutions provided in the present invention are also applicable to an application of another communication assembly, such as a communication base station.

Figure 8:
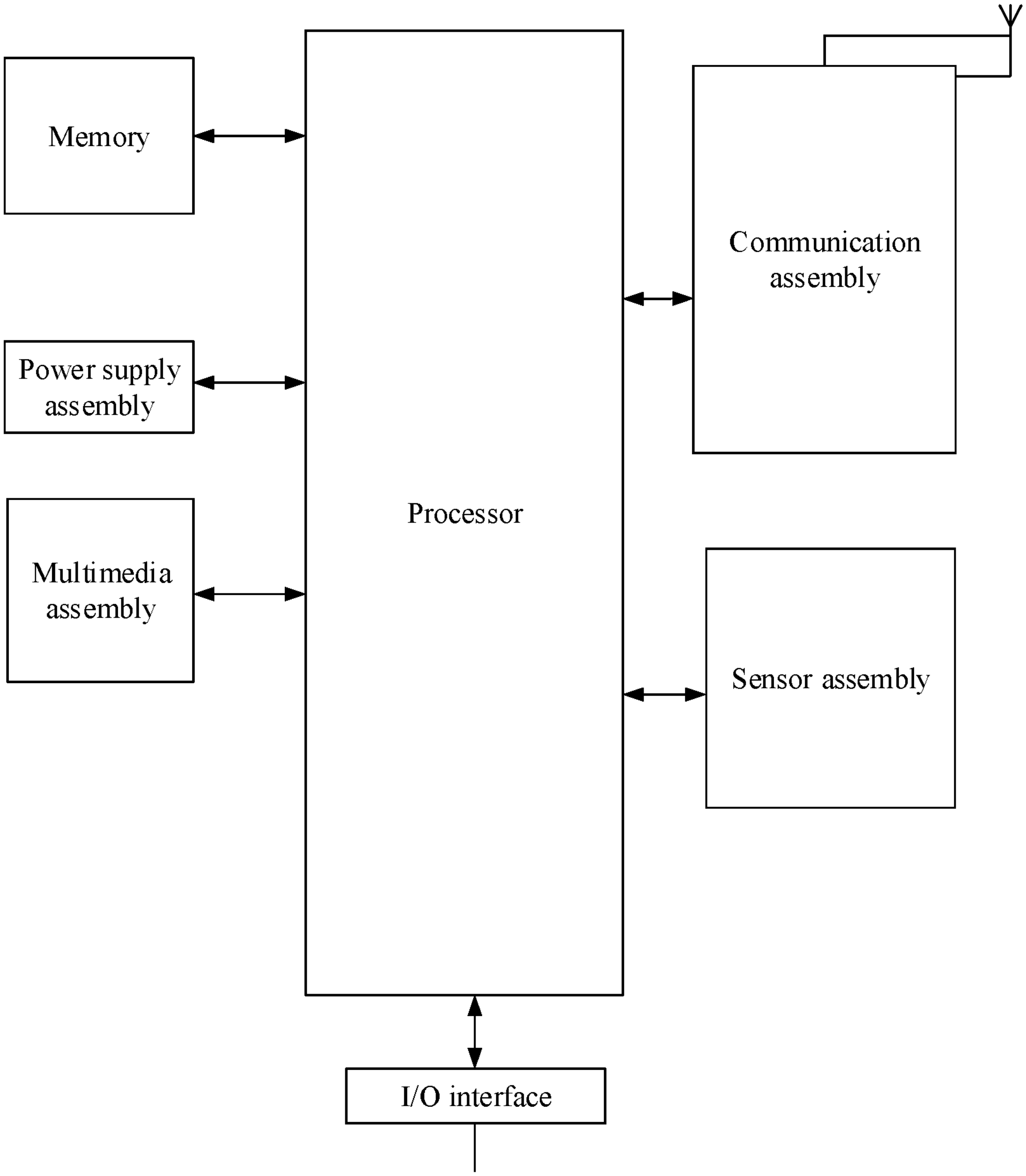
FIG. 8 is a schematic diagram of an electronic device using an RF switching circuit according to the present invention.

As shown in FIG. 8, the electronic device includes at least a processor and a memory, and may further include a communication assembly, a sensor assembly, a power supply assembly, a multimedia assembly, and an input/output (I/O) interface according to an actual requirement. The memory, the communication assembly, the sensor assembly, the power supply assembly, the multimedia assembly, and the I/O interface are connected to the processor. The memory may be a static random access memory (SRAM), an electrically erasable programmable read only memory (EEPROM), an erasable programmable read only memory (EPROM), a programmable read only memory (PROM), a read only memory (ROM), a magnetic memory, a flash memory, and the like. The processor may be a central processing unit (CPU), a graphics processing unit. (GPU), a field-programmable gate array (FPGA), an application specific integrated circuit (ASIC), a digital signal processing (DSP) chip, and the like. Another communication assembly, sensor assembly, power supply assembly, multimedia assembly, and the like may be implemented by using a general-purpose component. Details are not described herein.

It may be learned from a detailed description of the technical solutions of the present invention through the foregoing embodiments that the RF switching circuit having a high tolerance power provided in the present invention not only adopts the technical solution that the gates of the switch transistors in the stages are connected to a bias circuit composed of series resistors, but also adopts a technical solution that the bulks of the switch transistors in the stages are connected through a bias circuit composed of a transistor and the series resistors, which effectively improves a phenomenon of uneven distribution of the voltage swings in the stacked chain of the switch transistors in the stages. Therefore, the problem of nonlinearity of the RF switching circuit is alleviated, the insertion loss is reduced, and the average power withstanding capability is significantly improved. Therefore, the RF switching circuit having a high tolerance power provided in the present invention has beneficial effects of an ingenious structure design, low production costs, a small chip size, and an excellent operating performance.

The RF switching circuit having a high tolerance power, the chip, and the electronic device thereof provided in the present invention are described in detail above. For a person of ordinary skill in the art, any obvious change made to the present invention without departing from the essence of the present invention shall fall within the protection scope of the patent right of the present invention.

What is claimed is:

1. A radio frequency (RF) switching circuit having a high tolerance power, comprising a plurality of stages of switch transistor units connected in series, wherein the switch transistor unit in each stage comprises a first transistor, a second transistor, a first bias resistor, a second bias resistor, and a path resistor;

- a bulk of the first transistor is connected to a source and a bulk of the second transistor, and a drain of the second transistor is connected to a first path formed by the first bias resistors in the stages of switch transistor units connected in series in sequence;
- a drain of the first transistor is connected to an output terminal of the switch transistor unit in a previous stage, a source of the first transistor is connected to a gate of the second transistor, and also connected to a drain of a first transistor in the switch transistor unit in a next stage, and the path resistor is arranged between the drain and the source of the first transistor;
- a gate of the first transistor is connected to a second path formed by the second bias resistors in the stages of switch transistor units connected in series in sequence; and
- a tail end of the first path and a tail end of the second path are connected to a gate bias voltage.

2. An electronic device, comprising the RF switching circuit according to claim 1.

3. The RF switching circuit according to claim 1, wherein in odd-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence; and in even-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence; or in the odd-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence; and in even-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence.

4. The RF switching circuit according to claim 1, wherein in an initial stage of the plurality of stages of switch transistor units, the drain of the first transistor is connected to a signal input terminal of the RF switching circuit and a capacitor, and another end of the capacitor is connected to the drain of the second transistor.

5. The RF switching circuit according to claim 1, wherein an output terminal of the switch transistor unit in each stage is a source of a first transistor in the switch transistor unit in the stage.

6. The RF switching circuit according to claim 1, wherein, in the switch transistor unit in each stage, the source of the first transistor is connected to the gate of the second transistor.

7. The RF switching circuit according to claim 1, wherein, when the RF switching circuit is in an on state, a gate voltage and a bulk voltage of the first transistor in each of the stages of switch transistor units are respectively equal to half of a sum of a drain voltage and a source voltage.

8. The RF switching circuit according to claim 1, wherein, when the RF switching circuit is in an off state, a direct current (DC) voltage of the bulk of the first transistor in each of the stages of switch transistor units is the gate bias voltage.

9. An integrated circuit chip, comprising the RF switching circuit according to claim 1.

10. An RF switching circuit having a high tolerance power, formed by a plurality of stages of switch transistor units connected in series, wherein the switch transistor unit in each stage comprises a first transistor, a second transistor, a first bias resistor, a second bias resistor, and a path resistor;

a bulk of the first transistor is connected to a source and a bulk of the second transistor, and a gate of the first transistor is connected to a first path formed by the first bias resistors in the stages of switch transistor units connected in series in sequence;

a drain of the first transistor is connected to an output terminal of the switch transistor unit in a previous stage, a source of the first transistor is connected to a gate of the second transistor, and also connected to a drain of a first transistor in the switch transistor unit in a next stage, and the path resistor is arranged between the drain and the source of the first transistor;

a drain of the second transistor is connected to a second path formed by the second bias resistors in the stages of switch transistor units connected in series in sequence; and a tail end of the first path and a tail end of the second path are connected to a gate bias voltage.

11. The RF switching circuit according to claim 10, wherein in odd-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence; and in even-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence; or in the odd-numbered-stage switch transistor units, the gate of the first transistor is connected to the first path formed by the first bias resistors in the stages of switch transistor units connected in series in sequence, and the drain of the second transistor is connected to the second path formed by the second bias resistors in the stages of switch transistor units connected in series in sequence; and in even-numbered-stage switch transistor units, the gate of the first transistor is connected to the second path formed by the second bias resistors in the stages of switch transistor units connected in series in sequence, and the drain of the second transistor is connected to the first path formed by the first bias resistors in the stages of switch transistor units connected in series in sequence.

12. The RF switching circuit according to claim 10, wherein in an initial stage of the plurality of stages of switch transistor units, the drain of the first transistor is connected to a signal input terminal of the RF switching circuit and a capacitor, and another end of the capacitor is connected to the drain of the second transistor.

13. The RF switching circuit according to claim 10, wherein an output terminal of the switch transistor unit in each stage is a source of a first transistor in the switch transistor unit in the stage.

14. The RF switching circuit according to claim 10, wherein in the switch transistor unit in each stage, the source of the first transistor is connected to the gate of the second transistor.

15. The RF switching circuit according to claim 10, wherein when the RF switching circuit is in an on state, a gate voltage and a bulk voltage of the first transistor in each of the stages of switch transistor units are respectively equal to half of a sum of a drain voltage and a source voltage.

16. The RF switching circuit according to claim 10, wherein when the RF switching circuit is in an off state, a direct current (DC) voltage of the bulk of the first transistor in each of the stages of switch transistor units is the gate bias voltage.

* * * * *